United States Patent [19]
Tajima

[11] Patent Number: 5,924,481
[45] Date of Patent: *Jul. 20, 1999

[54] COOLING DEVICE FOR ELECTRONIC COMPONENT

[75] Inventor: Makoto Tajima, Tokyo, Japan

[73] Assignee: Calsonic Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/667,805

[22] Filed: Jun. 20, 1996

[30] Foreign Application Priority Data

Jun. 22, 1995 [JP] Japan ................................. 7-156102

[51] Int. Cl.⁶ ...................................... F28D 15/00
[52] U.S. Cl. ................ 165/104.33; 165/104.21; 361/700; 257/715; 174/15.2
[58] Field of Search ............ 165/104.33, 104.21, 165/104.26; 361/700, 701, 702; 257/715, 714; 174/15.2

[56] References Cited

U.S. PATENT DOCUMENTS

| | | | |
|---|---|---|---|
| 2,636,752 | 4/1953 | Schane et al. | 165/104.33 X |
| 3,143,592 | 8/1964 | August | 165/104.21 X |
| 3,476,175 | 11/1969 | Plevyak | 165/104.33 X |
| 3,653,433 | 4/1972 | Scharli | 165/80.3 |
| 4,513,346 | 4/1985 | Devins | 361/700 X |
| 4,724,901 | 2/1988 | Munekawa | 165/104.33 X |
| 4,941,530 | 7/1990 | Crowe | 165/104.33 |
| 5,168,919 | 12/1992 | Berenholz et al. | 165/104.33 X |
| 5,216,580 | 6/1993 | Davidson et al. | 361/700 |
| 5,252,778 | 10/1993 | Ogawa | 165/104.33 X |

FOREIGN PATENT DOCUMENTS

| | | | |
|---|---|---|---|
| 1266244 | 5/1961 | France | 165/104.33 |
| 59-217346 | 12/1984 | Japan | 165/104.33 |
| 62014446 | 1/1987 | Japan | 257/715 |
| 3190153 | 8/1991 | Japan | 257/715 |
| 5190714 | 7/1993 | Japan | 257/715 |

*Primary Examiner*—Ira S. Lazarus
*Assistant Examiner*—Christopher Atkinson
*Attorney, Agent, or Firm*—Sughrue, Mion, Zinn, Macpeak & Seas, PLLC

[57] ABSTRACT

A header tank for accommodating refrigerant is formed on one side of the cold plate, on the other side of which an electronic component is mounted. A plurality of loop pipes in which the refrigerant is circulated are connected with the header tank. The plurality of loop pipes are arranged substantially parallel with the cold plate. The radiating area of the loop pipes distant from the cold plate is larger than the radiating area of the loop pipes close to the cold plate.

10 Claims, 3 Drawing Sheets

5,924,481

COOLING DEVICE FOR ELECTRONIC COMPONENT

BACKGROUND OF THE INVENTION

1. Field of the Invention

The present invention relates-to a cooling device for an electronic component such as a rectifier diode by which heat is generated in the operation.

2. Description of the Prior Art

A conventional heat sink for cooling an electronic component such as a rectifier diode by which heat is generated in the operation is disclosed, for example, in Japanese Utility Model Publication No. Sho. 55-75198.

FIG. 4 is a view showing the heat sink disclosed in the above utility model publication. In this heat sink, an electronic component 13 such as a rectifier diode by which heat is generated is fixed to one side of an attaching member 11 with screws 15, and a plurality of radiating plates 17 are fixed to the other side of the attaching member 11.

Undulated radiating fins 19 are arranged among the radiating plates 17.

In this heat sink, the heat generated by the electronic component 13 is transmitted to the undulated radiating fins 19 via an attaching member 11 and the radiating plates 17. Thus transmitted heat is radiated from the undulated radiating fins 19 to the atmosphere. Therefore, the electronic component 13 can be effectively cooled.

However, according to the above conventional heat sink, the electronic component 13 is cooled by natural radiation conducted by the radiating plates 17 and the undulated radiating fins 19. Accordingly, the above conventional heat sink is disadvantageous in that the cooling efficiency is low.

When the capacity of the electronic component 13 is increased, a quantity of heat generated by the electric component 13 is also increased. Therefore, the length of the radiating plates 17 is necessarily increased. However, when the radiating plates 17 are, longer the heat transmission efficiency of the radiating plates 17 is decreased in the heat transmission from the radiating plates 17 to the heat radiating fins 19. This decrease in heat transmission is originated from the heat conductivity of the radiating plate 17. Therefore, even if the number of the radiating fins 19 is increased so as to increase the radiating area, the cooling capacity is not increased. In other words, it is difficult to increase a quantity of heat radiated from the radiating fins, so that the electronic component 13 can not be cooled well.

SUMMARY OF THE INVENTION

The present invention has been accomplished to solve the above conventional problems. An object of the present invention is to provide a cooling device for an electronic component capable of greatly enhancing the cooling efficiency.

According to the present invention, there is provided a cooling device-for an electronic component comprising: a cold plate, the electronic component being mounted on one side thereof; a header tank for accommodating refrigerant and mounted on the other side of the cold plate; and a plurality of loop pipes in which the refrigerant -is circulated, the loop pipes being connected with the header tank, and the loop pipes being arranged substantially parallel with the cold plate.

In the cooling device according to the present invention, the loop pipes may have a first portion which is close to the cold plate and a second portion which is distant from the cold plate, and the radiating area of the second portion is larger than the radiating area of the first portion.

The cooling device according to the present invention, may further comprise a multi-hole-pipe container manufactured by extrusion molding and the loop pipes comprise pipes formed in the multi-hole-pipe container.

In the cooling device for an electronic component according to the present invention, heat generated by the electronic component mounted on one side of the cold plate is conducted to a refrigerant accommodated in a header tank mounted on the other side of the cold plate.

Due to the thus conducted heat, the refrigerant is evaporated and flows into the loop pipes. While the evaporated refrigerant passes in the loop pipes, heat is exchanged between the loop pipes and the outside air, so that the evaporated refrigerant is condensed and liquidized. Then the liquidized refrigerant is guided to the header tank.

And when the radiating area of the loop pipes distant from the cold plate is larger than the radiating area of the loop pipes close to the cold plate, the cooling efficiency of the loop pipes on the distant side is higher than the cooling efficiency of the loop pipes on the close side.

As a result, the condensation of vapor is facilitated on the distant side, so that the pressure in the loop pipes on the distant side becomes lower than the pressure in the loop pipes on the close side. Accordingly, the refrigerant flows from the distant side to the close side. In this way, the refrigerant positively circulates into the header tank.

When the plurality of loop pipes are composed of a multi-hole-pipe container manufactured by extrusion mold, the plurality of loop pipes can be easily, positively formed.

DETAILED DESCRIPTION OF THE PREFERRED EMBODIMENT

Figure 1:
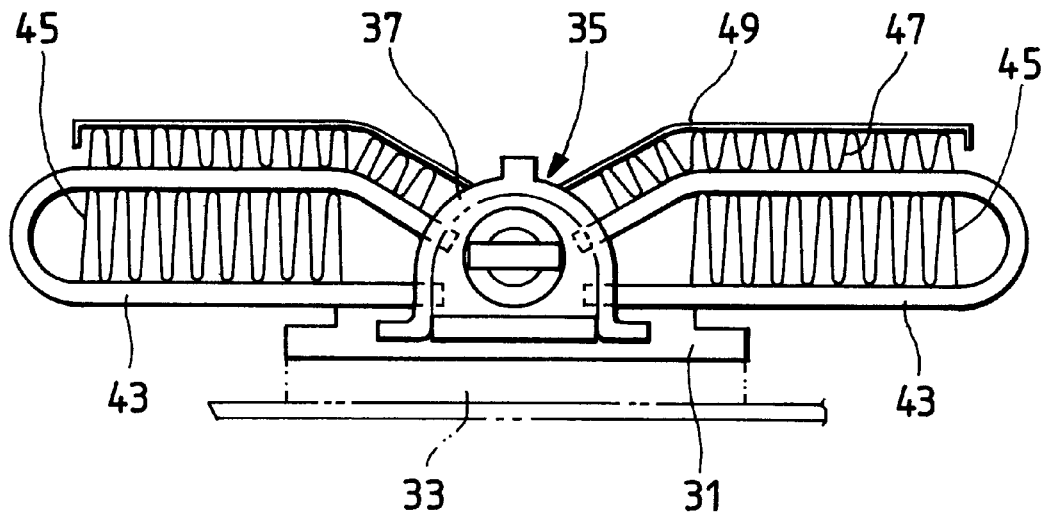
FIG. 1 is a front view of the cooling device for cooing an electronic component of an embodiment of the present invention.
Figure 2:
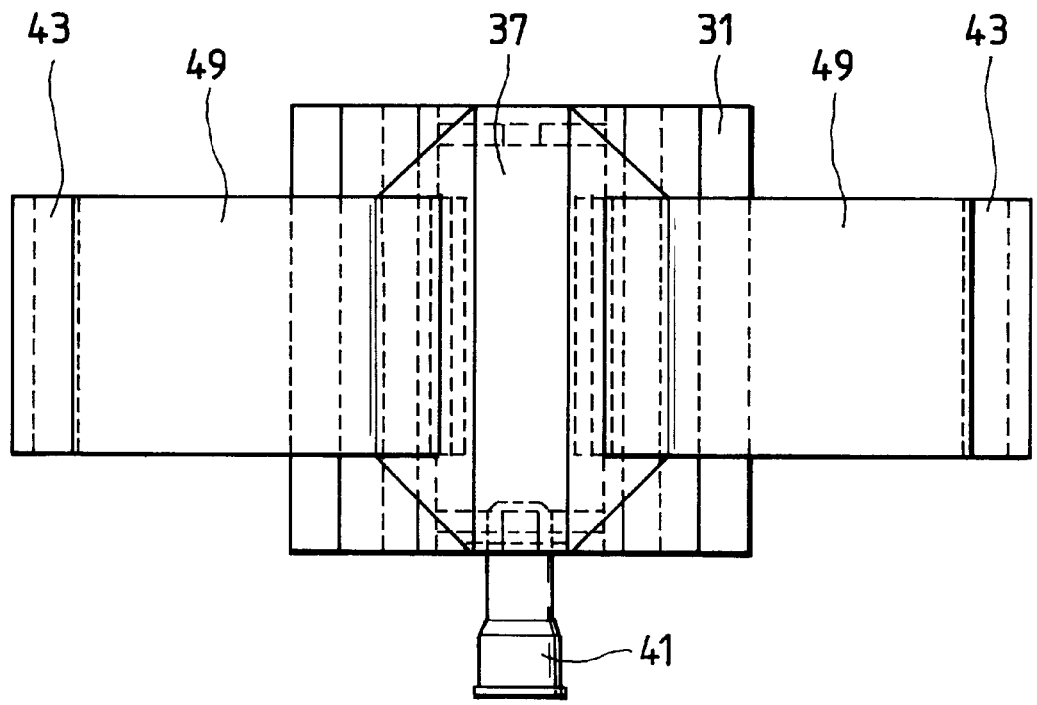
FIG. 2 is an upper face view of FIG. 1.

An embodiment of the present invention shown in the drawings will be explained in detail as follows.

FIGS. 1 to 3 and FIG. 5 are views showing an embodiment of the cooling device for an electronic component of the present invention. In the drawings, reference numeral 31 is a rectangular cold plate.

This cold plate 31 is made of metal such as aluminum, the heat conductivity of which is high.

An electronic component 33 such as an LSI chip or a multi-chip module (MCM) in which LSI chips are integrated is made to adhere onto one side of the cold plate 31 with an adhesive agent, the heat conductivity of which is high.

On the other side of the cold plate 31, a header tank 35 for accommodating the refrigerant is integrally formed.

Figure 3:
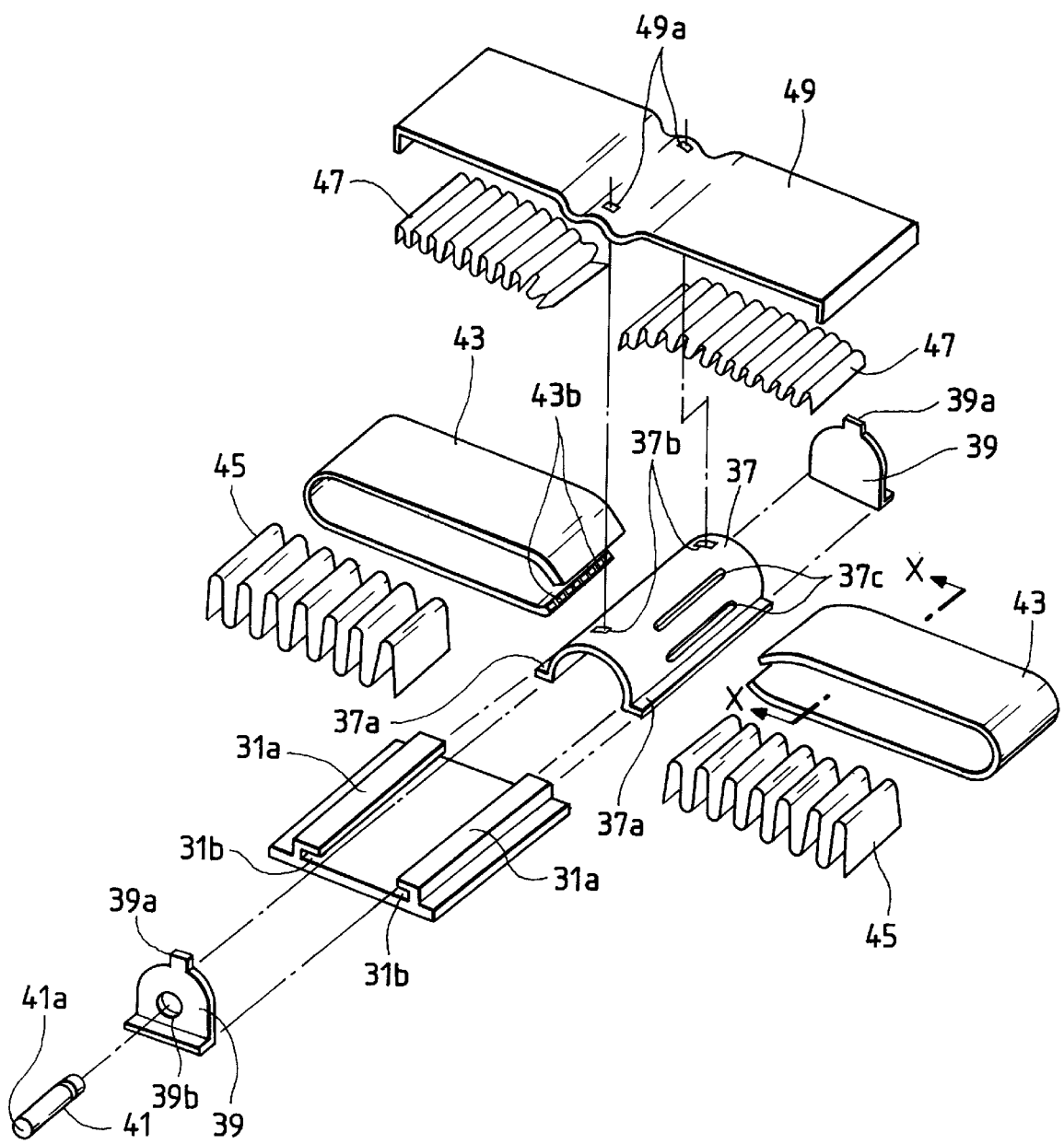
FIG. 3 is an exploded perspective view of FIG. 1.
Figure 4:
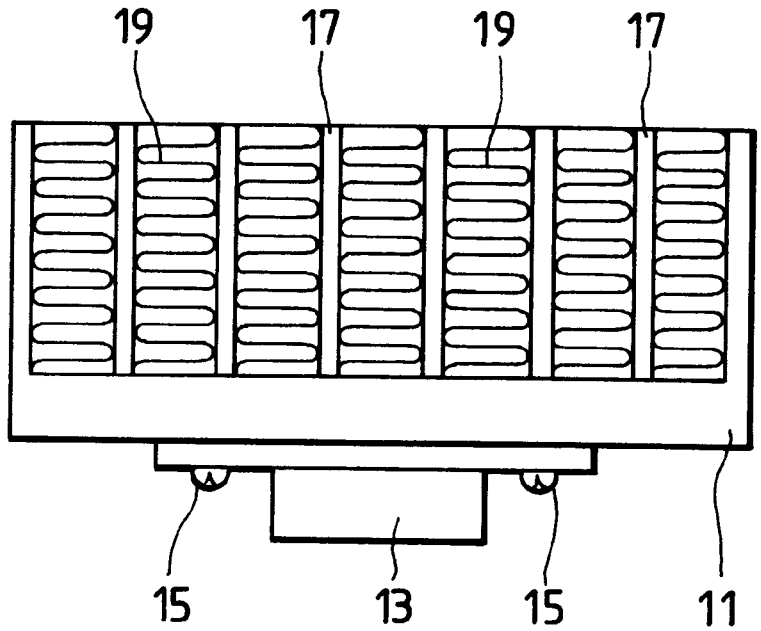
FIG. 4 is a side view of the conventional heat sink.

As shown in FIG. 3, two protrusions 31a, the shapes of which are a reverse L, are integrally formed on the cold plate 31 at a predetermined interval.

There is formed an engaging groove 31b in each protrusion 31a. Engaging portions 37a formed on both sides of a semicircular cylindrical tank member 37 made of aluminum are inserted into the engaging grooves 31b of the protrusions 31a.

Both sides of the tank member 37 are closed by end patches 39 made of, for example, aluminum. A protrusion 39a formed at the upper portion of each end patch 39 is engaged with an engaging hole 37b formed in the upper portion of the tank member 37.

In one of the end patches 39, a circular engaging hole 39b is formed. A filling tube 41 made of aluminum is inserted into the circular engaging hole 39b.

On the outer circumferential surface of the tank member 37, two long holes 37c are formed on each side. Both end portions of a multi-hole-pipe container 43, which has been folded in two pieces, are inserted into the long holes 37c on one side, and both end portions of another multi-hole-pipe container 43, which has been folded in two pieces, are inserted into the long holes 37c on the other side.

The multi-hole-pipe container 43 is arranged in such a manner that the extending direction of the multi-hole-pipe container 43 is parallel with the cold plate 31.

The multi-hole-pipe container 43 is made of metal such as aluminum, the heat conductivity of which is high.

Figure 5:
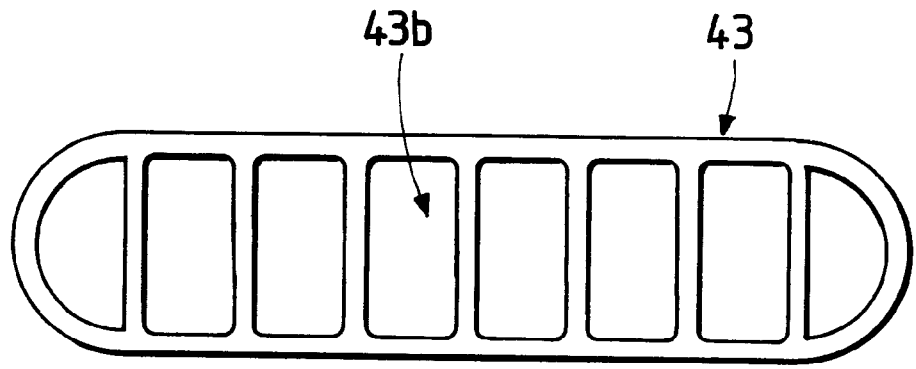
FIG. 5 is a sectional view of a multi-hole-pipe container taken along line X—X in FIG. 3.

The multi-hole-pipe container 43 is formed by extrusion molding. In FIG. 5, there is shown a sectional view of the multi-hole-pipe container 43 taken along line X—X in FIG. 3. As shown in FIG. 5, in the multi-hole-pipe container 43, there are provided a plurality of loop pipes 43b that are arranged at regular intervals in the width direction.

The multi-hole-pipe container 43 is folded in two pieces while a predetermined space is formed between the folded multi-hole-pipe container 43. In this space, there are arranged main fins 45.

Outside the loop pipes 43b of the multi-hole-pipe container 43 on the side distant from the cold plate 31, there are arranged top fins 47, and the outside of these top fins 47 are covered with a top plate 49.

In this connection, the main fins 45 and the top fins 47 are made of metal such as aluminum, the heat conductivity of which is high.

The above cooling device for cooling an electronic component is assembled as follows. For example, the engaging portions 37a of the tank member 37 are engaged with the protrusions 31a of the cold plate 31; the protrusions 39a of the end patches 39 are inserted into the engaging holes 37b formed on both sides of the tank member 37 so that the end patches 39 can be incorporated; the filling tube 41 is incorporated into one of the end patches 39; the end portions of the multi-hole-pipe container 43 into which the main fins 45 are incorporated are inserted into the long holes 37c of the tank member 37; the top fins 47 are arranged outside the multi-hole-pipe container 43; these top fins 47 are covered with the top plate 49; the protrusions 39a of the end patches 39 are inserted into the engaging holes 49a of the top plate 49; and the protrusions 39a are bent so that the end patches can be fixed.

After the parts have been assembled in this way, they are put into a soldering furnace and soldered so as to be integrated with each other.

Then, a predetermined quantity of refrigerant such as acetone or Freon is injected into the header tank 35 through a refrigerant inlet 41a formed in the filling tube 41 arranged in the end patch 39. After that, the header tank 35 and the multi-hole-pipe container 43 are vacuumized through the refrigerant inlet 41a, and then the refrigerant inlet 41a of the filling tube 41 is closed.

In the above cooling device for cooling an electronic component, heat generated by the electronic component 33 attached onto one side of the cold plate 31 is conducted via the cold plate 31 to the refrigerant accommodated in the header tank 35 directly formed on the other side of the cold plate 31.

Due to the thus conducted heat, the refrigerant in the header tank 35 is evaporated. The evaporated refrigerant flows into the loop pipes 43b in the multi-hole-pipe container 43 which are on the side distant from the cold plate 31. While the refrigerant passes in the loop pipes 43b, heat is exchanged between the refrigerant and the outside air through the main fins 45 and the top fins 47. Due to the foregoing, the refrigerant is cooled and condensed. The liquidized refrigerant is circulated from the loop pipes 43b in the multi-hole-pipe container 43 which are on the side close to the cold plate 31, into the header tank 35.

In the above electronic cooling device for cooling an electronic component, heat generated by the electronic component 33 is conducted via the cold plate 31 to the refrigerant accommodated in the header tank 35 provided on the other side of the cold plate 31. Due to the thus conducted heat, the refrigerant evaporates and flows into the loop pipes 43b. While the refrigerant is passing in the loop pipes 43b, the heat is exchanged between the refrigerant and the outside air, so that the refrigerant is cooled and condensed. The refrigerant is introduced into the header tank 35 under the liquidized condition. Therefore, as compared with a conventional cooling device, the cooling efficiency of the cooling device can be greatly enhanced when the electronic component 33 is cooled.

In the above cooling device for cooling an electronic component, the heat generated by the electronic component 33 is introduced into the loop pipes container 43b by utilizing the latent heat of the refrigerant. Accordingly, it becomes possible to effectively introduce the heat generated by the electronic component 33 into the multi-hole-pipe container 43. Therefore, the cooling efficiency can be greatly enhanced when the electronic component 33 is cooled.

Accordingly, the heat sink of this embodiment can radiate a larger quantity of heat than that of the conventional heat sink in which the electronic component 33 is cooled by natural radiation.

In the above cooling device for cooling an electronic component, the multi-hole-pipe container 43 is arranged substantially in parallel with the cold plate 31. Accordingly, it is possible to reduce the height of the cooling device for cooling an electronic component. Therefore, the heat sink of this embodiment can be easily arranged in a casing.

In the heat sink of this embodiment, since a plurality of loop pipes 43b are composed of the multi-hole-pipe container 43, they can be easily, positively made, and it is possible to form highly reliable loop pipes 43b.

In the above cooling device for an electronic component, the top fins 47 are arranged on the side of the multi-hole-pipe container 43 which is distant from the cold plate 31, so that the radiating area of the loop pipes 43b on the side distant from the cold plate 31 is made to be larger than the radiating area of the loop pipes 43b on the side close to the cold plate 31. Accordingly, it is possible to positively circulate the refrigerant in the loop pipes 43b.

In this case, the cooling efficiency of the loop pipes 43b on the side distant from the cold plate 31 is enhanced. As a result, the condensation of vapor is facilitated in the loop pipes 43b on the side distant from the cold plate 31. Accordingly, the pressure in the loop pipes 43b on the distant side becomes lower than the pressure in the loop pipes 43b on the close side. Therefore, the refrigerant flows from the loop pipes 43b on the distant side to the loop pipes 43b on the close side and circulates into the header tank 35 positively.

Since a plurality of loop pipes 43b are communicated with each other by the header tank 35, the refrigerant can be easily, positively injected into the loop pipes 43b via the filling tube 41 arranged in the end patch 39, and also the plurality of loop pipes 43b and the header tank 35 can be easily, positively vacuumized via the filling tube 41.

In the above cooling device for an electronic component, the refrigerant uniformly flows on the overall surface of the cold plate 31. Therefore, heat spots are not caused on the surface of the cold plate 31, and the electronic component 33 can be positively protected from heat.

In the above embodiment, the present invention is applied to the electronic component 33 composed of MCM. However, it should be noted that the present invention is not limited to the specific embodiment. It is possible to apply the present invention to electronic elements by which heat is electrically generated in the operation.

As described above, in the cooling device for an electronic component according to the present invention, the heat radiated from the electronic component is conducted via the cold plate to the refrigerant accommodated in the header tank formed on one side of the cold plate. The refrigerant is evaporated by the heat conducted in this way. Then the refrigerant flows into the loop pipes. While the refrigerant is passing in the loop pipes, heat is exchanged between the refrigerant and the outside air, and the refrigerant is guided into the header tank under the liquidized condition. Consequently, the cooling efficiency of the electronic component can be greatly enhanced as compared with a conventional heat sink.

In the above cooling device for cooling an electronic component, the loop pipes are arranged substantially in parallel with the cold plate. Accordingly, it is possible to reduce the height of the cooling device for cooling an electronic component. Therefore, the heat sink of this embodiment can be easily arranged in a casing.

When the radiating area of the loop pipes on the side distant from the cold plate is larger than the radiating area of the loop pipes on the side close to the cold plate, it is possible to positively circulate the refrigerant in the loop pipes.

When a plurality of loop pipes are composed of the multi-hole-pipe plate, the plurality of loop pipes can be easily, positively made.

What is claimed is:

1. A cooling device for an electronic component comprising:

a cold plate having a flat shape with a top and bottom side, the electronic component being mounted on the bottom side thereof;

a header tank for accommodating refrigerant and mounted on the top side of the cold plate, wherein the top side of the cold plate functions as a bottom wall of the header tank so that heat generated from the electronic component is conducted via the cold plate to the refrigerant; and a pair of multi-hole-pipe containers, each forming a plurality of integrally formed loop pipes in which the refrigerant is circulated, the loop pipes having ends being connected with the header tank, and the loop pipes being arranged substantially parallel with the cold plate and parallel to each other so that the loop pipes are disposed directly adjacent to each other, wherein the pair of multi-hole-pipe containers are each bent so that the ends of the loop pipes communicate with each other at the header tank.

2. The cooling device according to claim 1, wherein the loop pipes have a first portion which is close to the cold plate and a second portion which is distant from the cold plate, and the radiating area of the second portion is larger than the radiating area of the first portion.

3. The cooling device according to claim 2, further comprising a main fin disposed between the first portion and the second portion.

4. The cooling device according to claim 3, further comprising a top fin disposed on the second portion and opposite to the main fin.

5. The cooling device according to claim 4, further comprising a top plate disposed on the top fin and opposite to the top fin.

6. A cooling device for an electronic component comprising:

conducting means for conducting heat generated by the electronic component;

accommodating means for accommodating refrigerant and mounted on conducting means; and circulating means for circulating the refrigerant, said circulating means being connected with said accommodating means, wherein said circulating means comprises a pair of multi-hole-pipe containing means manufactured by extrusion molding, said multi-hole-pipe containing means extending outward from opposite sides of said accommodating means and said conducting means, so that said multi-hole-pipe containing means are planar with each other.

7. The cooling device according to claim 6, wherein said multi-hole-pipe containing means is folded in two pieces, a first piece of said two pieces being close to said conducting means and a second piece of said two pieces being distant from said conducting means, and a radiating area of said second piece being larger than a radiating area of said first piece.

8. The cooling device according to claim 7, further comprising a first radiating means disposed between said first piece and said second piece.

9. The cooling device according to claim 8, further comprising a second radiating means disposed on said second piece and opposite to said first radiating means.

10. The cooling device according to claim 9, further comprising a third radiating means disposed on said second radiating means and opposite to said second radiating means.

\* \* \* \* \*